(12) United States Patent
Byargeon et al.

(10) Patent No.: US 9,743,550 B2
(45) Date of Patent: Aug. 22, 2017

(54) RAIL FOR MOUNTING A RACK-MOUNTABLE COMPONENT

(71) Applicant: Hewlett-Packard Development Company, L.P., Houston, TX (US)

(72) Inventors: David T. Byargeon, Houston, TX (US); Keith A. Sauer, Spring, TX (US); Kevin P. Bold, Houston, TX (US); Kevin D. Conn, Montgomery, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/906,287

(22) PCT Filed: Jul. 26, 2013

(86) PCT No.: PCT/US2013/052274
§ 371 (c)(1),
(2) Date: Jan. 20, 2016

(87) PCT Pub. No.: WO2015/012861
PCT Pub. Date: Jan. 29, 2015

(65) Prior Publication Data
US 2016/0165746 A1      Jun. 9, 2016

(51) Int. Cl.
*A47B 96/06*         (2006.01)
*H05K 7/18*          (2006.01)
(Continued)

(52) U.S. Cl.
CPC ............. *H05K 7/183* (2013.01); *A47B 96/06* (2013.01); *F16B 2/18* (2013.01); *F16M 13/022* (2013.01); *G06F 1/16* (2013.01); *H05K 7/1489* (2013.01)

(58) Field of Classification Search
CPC ........ H05K 7/183; H05K 7/1489; H05K 7/18; A47B 96/06; A47B 88/0418; A47B 96/07; A47B 47/0083; A47B 57/487; A47B 57/14; A47B 57/16; F16B 2/18; F16B 21/06; G06F 1/16; G06F 1/187
(Continued)

(56) References Cited

U.S. PATENT DOCUMENTS 6,456,501 B1    9/2002    Rubenstein et al.
6,666,484 B1    12/2003   Branch et al.
(Continued)

FOREIGN PATENT DOCUMENTS

JP      2010062264      3/2010
WO      WO-2012072440   6/2012

OTHER PUBLICATIONS

Oracle; Oracle® Database Appliance Owner's Guide Release 2.6 for Linux x86-64 Part No. E23341-14 ; 2011.

*Primary Examiner* — Christopher E Garft
(74) *Attorney, Agent, or Firm* — Brooks, Cameron & Huebsch, PLLC (57) ABSTRACT

A rail for mounting a rack-mountable component can include a longitudinal member having a first flange, a spring located proximal to the first end and having an uncompressed state and a compressed state, and a latch having a trigger arm and a cam arm, wherein moving the trigger arm toward the first flange engages the cam arm with the spring to transition the spring from the uncompressed state to the compressed state.

20 Claims, 6 Drawing Sheets

(51) Int. Cl.
    *G06F 1/16*     (2006.01)
    *H05K 7/14*     (2006.01)
    *F16B 2/18*     (2006.01)
    *F16M 13/02*     (2006.01)

(58) Field of Classification Search
    USPC .................................... 248/231.31; 312/333
    See application file for complete search history.

(56) References Cited

U.S. PATENT DOCUMENTS

| | | | |
|---|---|---|---|
| 7,144,184 B1 * | 12/2006 | Tsai | F16B 7/0486 |
| | | | 211/192 |
| 7,318,532 B1 | 1/2008 | Lee et al. | |
| 7,744,177 B2 * | 6/2010 | Peng | A47B 88/43 |
| | | | 312/223.1 |
| 8,297,721 B2 | 10/2012 | Yu et al. | |
| 8,358,502 B2 | 1/2013 | Gomez | |
| 8,371,454 B2 * | 2/2013 | Chen | H05K 7/1421 |
| | | | 211/26 |
| 8,662,607 B2 * | 3/2014 | Fan | H05K 7/1489 |
| | | | 312/333 |
| 2003/0111436 A1 | 6/2003 | Basinger | |
| 2004/0108427 A1 * | 6/2004 | Chen | A47B 57/40 |
| | | | 248/244 |
| 2004/0217073 A1 | 11/2004 | Dobler et al. | |
| 2008/0053933 A1 | 3/2008 | Allen | |
| 2008/0073469 A1 | 3/2008 | Mushan | |
| 2011/0100936 A1 | 5/2011 | Chang et al. | |
| 2012/0305511 A1 | 12/2012 | Schluter | |

\* cited by examiner

RAIL FOR MOUNTING A RACK-MOUNTABLE COMPONENT

BACKGROUND

Computing systems can include a variety of components. Rack-mountable components can be mounted to a rack. Racks can include vertical support members. Rails can be mounted between the vertical support members to support the rack-mountable components. Rails can be placed at various vertical locations of the rack to support multiple rack-mountable components in a vertical arrangement.

DETAILED DESCRIPTION

Rails can be utilized for mounting a rack-mountable component to a rack. An example of a rack-mountable component is a server, among other rack-mountable components.

Racks employed to mount rack-mountable components may have various sizes. Some standardized racks include 19-inch (482.6 millimeter) racks and 23-inch (580 millimeter) racks. For example, 19-inch racks can be employed to mount rack-mountable components that have front panels having a width of 19 inches and 23-inch racks can be employed to mount rack-mountable components that have front panels having a width of 23 inches. Formal standards for the racks are available from the Electronic Industries Alliance, the Consumer Electronics Association, and the International Electrotechnical Commission, among others.

Four post racks, e.g., racks having four vertical support members, can provide that the rack-mountable component is supported near the front of the rack-mountable component and near the back of the rack-mountable component. For four post racks, two rails are utilized to mount a rack-mountable component. A first rail is coupled to two posts, e.g., a front left post and a back left post, and a second rail is coupled to two posts, e.g., a front right post and a back right post.

Racks employed to mount rack-mountable components can be divided into regions. For example, a region that is 1.75 inches (44.45 millimeters) in height can be referred to as a "U" (for unit) or as a "rack unit".

Rack-mountable components, e.g., servers, are available in various sizes. For example, 1 U rack-mountable components, 2 U rack-mountable components, and 3 U rack-mountable components, among other rack-mountable components, are available. As the size of rack-mountable components increases, the size of the rails utilized for mounting the rack-mountable component can correspondingly increase. For example, the rails utilized for mounting a 2 U rack-mountable component can be larger than the rails utilized for mounting a relatively smaller 1 U rack-mountable component.

To support various configurations, the rails utilized for mounting a rack-mountable component to a rack should be readily attachable to and removable from the rack. Previous rails have utilized a release latch that engaged in a direction perpendicular to a direction that the rail is to be removed. For these previous rails, two hands are utilized to remove a rail; one hand to compress the release latch and the other to remove the rail. For larger rails, e.g., rails utilized for mounting a 2 U or greater rack-mountable component, supporting the weight of the rail with only one hand to remove the rail, while the other hand compresses the release latch in a direction perpendicular to a direction that the rail is to be removed, may be difficult.

Examples of the present disclosure include rails and systems including rails for mounting a rack-mountable component to a rack. The rails disclosed herein can include a latch having a trigger arm and a cam arm. To remove the rail a spring is compressed by moving the trigger arm in a direction parallel to a direction that the rail is to be removed. In some examples, the rails disclosed herein can help provide more control of the rail as the rail is being removed, as compared to some other rails, such as rails having a release latch that engages in a direction perpendicular to a direction that the rail is to be removed.

In the present disclosure, reference is made to the accompanying drawings that form a part hereof, and in which is shown by way of illustration how a number of examples of the disclosure can be practiced. These examples are described in sufficient detail to enable those of ordinary skill in the art to practice the examples of this disclosure, and it is to be understood that other examples can be used and that structural changes can be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

Figure 1:
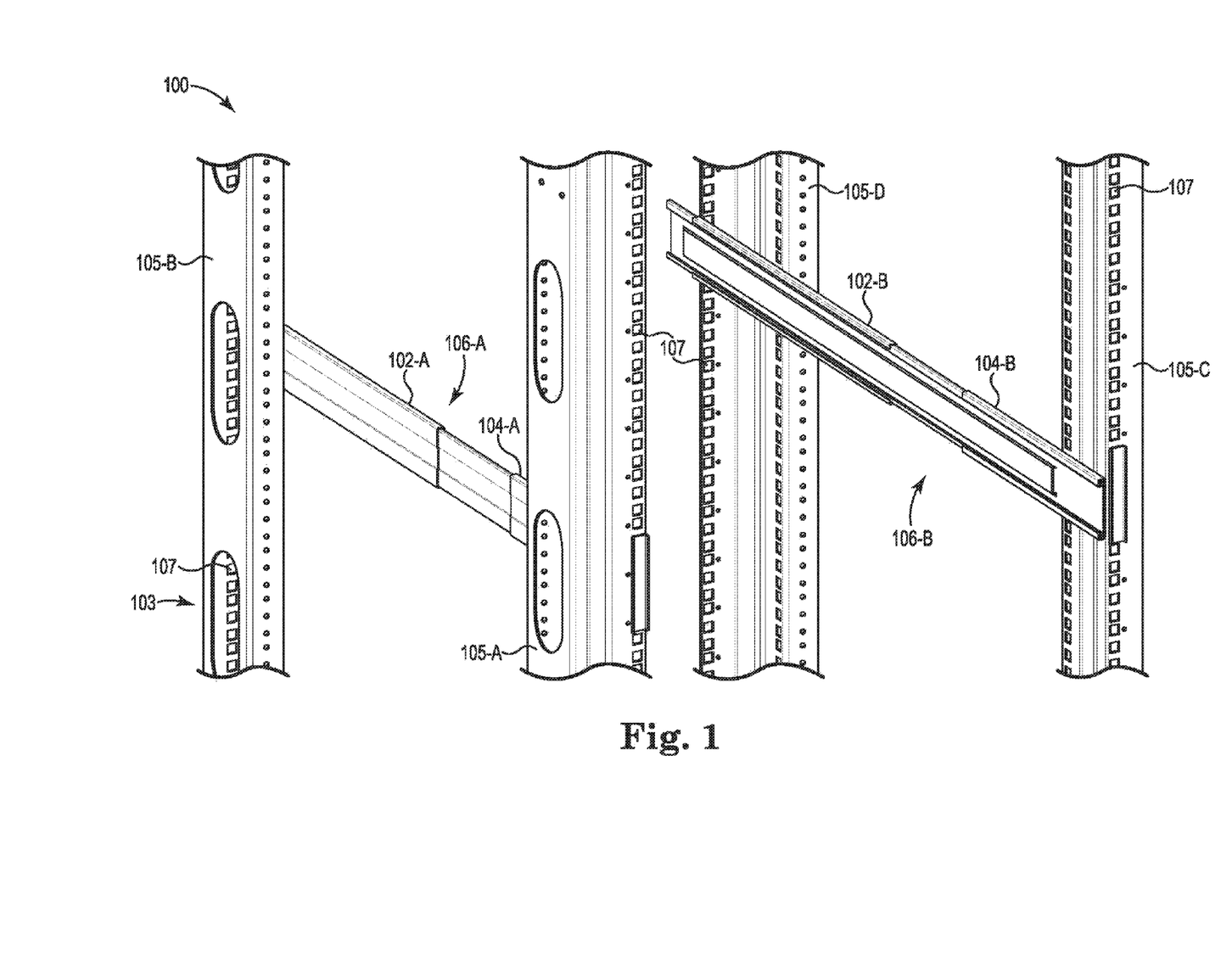
FIG. 1 illustrates an example of a system for mounting a rack-mountable component.

FIG. 1 is an example of a system 100 for mounting a rack-mountable component according to the present disclosure. The system 100 can include a first rail 102-A and a second rail 102-B. Each of the rails 102 can be coupled to a rack 103. For instance as illustrated in FIG. 1, rail 102-A is coupled to left front post 105-A and left back post 105-B and rail 102-B is coupled to right front post 105-C and right back post 105-D.

The rack 103 can be a 19-inch, a 23-inch rack, or another type of rack. The posts 105 can include a number of holes 107. The holes 107 can be formed by a surface of the respective post 105. The holes 107 can have a variety of shapes; for example, the holes can have a circular shape, a square shape, or a diamond shape, among other shapes. The holes 107 can be threaded or smooth.

Examples of the present disclosure provide that the rail 102-A and the rail 102-B are mirror images of one another; however examples are not so limited.

Each of the rails 102 can include an outer portion, e.g., outer portions 104-A, 104-B respectively. As discussed further herein, the outer portion 104 can be configured to engage a rack, e.g. rack 103.

Each of the rails 102 can include an inner portion, e.g., inner portions 106-A (hidden from view), 106-B respectively. The inner portion 106 can be configured to engage a rack-mountable component, e.g., a server. For instance, the inner portion 106 can include a number of spaces, e.g., openings, configured to receive a protrusion, e.g., a tab or a pin, associated with a rack-mountable component. The inner portion 106 of rail 102 can be slidably coupled to the outer portion 104 of rail 102. For example, inner portion 106 may be extended from the outer portion 104, to help allow a rack-mountable component be engaged by the inner portion 106, for instance. After the rack-mountable component is engaged by the inner portion 106, the inner portion may be retracted to house the rack-mountable component in the rack 103.

Figure 2A:
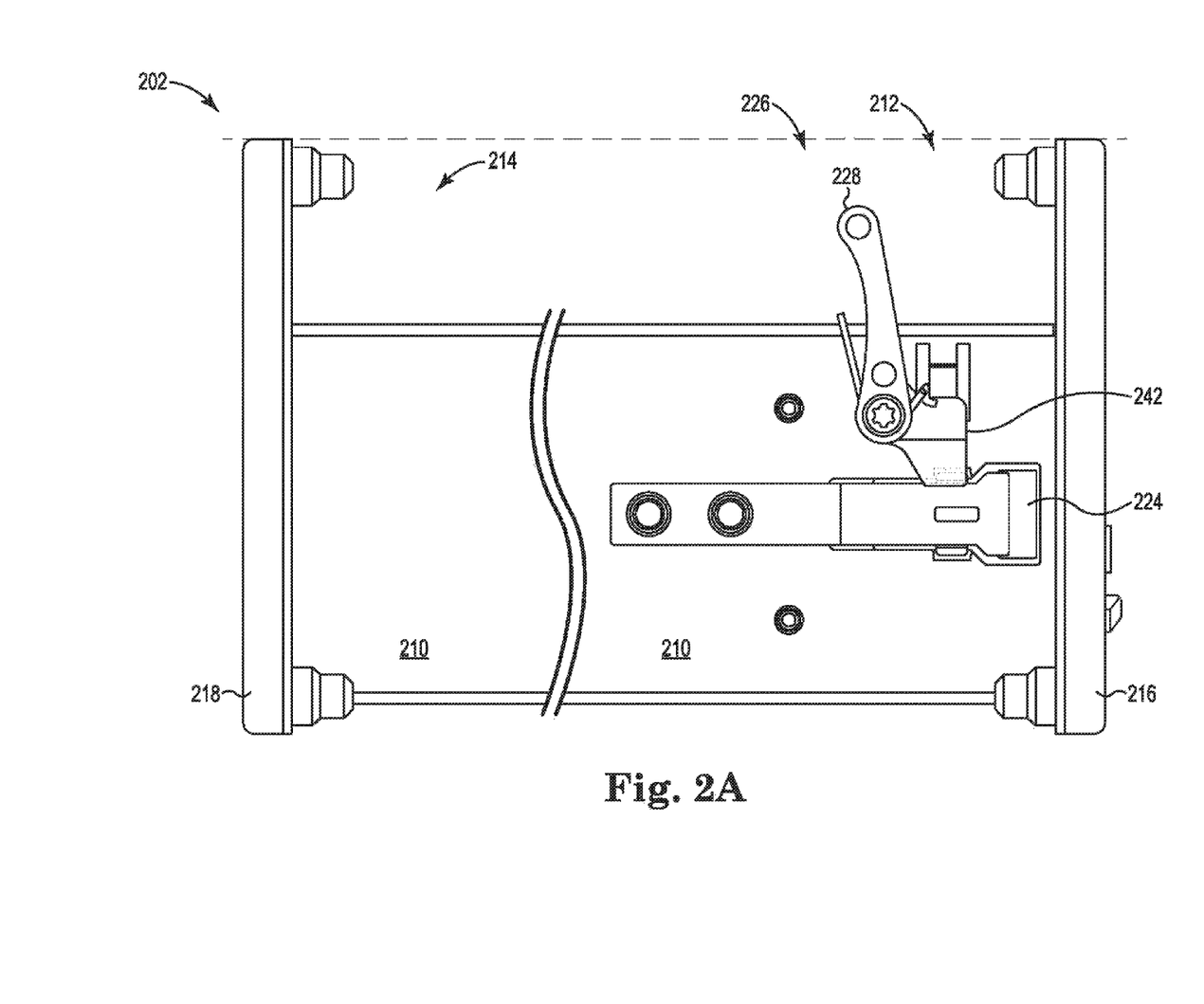
FIG. 2A illustrates an example of a portion of a rail for mounting a rack-mountable component.

FIG. 2A illustrates an example of a portion of a rail 202 for mounting a rack-mountable component. The rail 202 can include a longitudinal member 210, having a first end 212 and a second end 214. The longitudinal member 210 can have a first flange 216 coupled to the first end 212 and a second flange 218 coupled to the second end 214. The rail 202 can include a spring 224. The rail 202 can include a latch 226 having a trigger arm 228 and a cam arm 224. The rail 202 is discussed further herein.

Figure 2B:
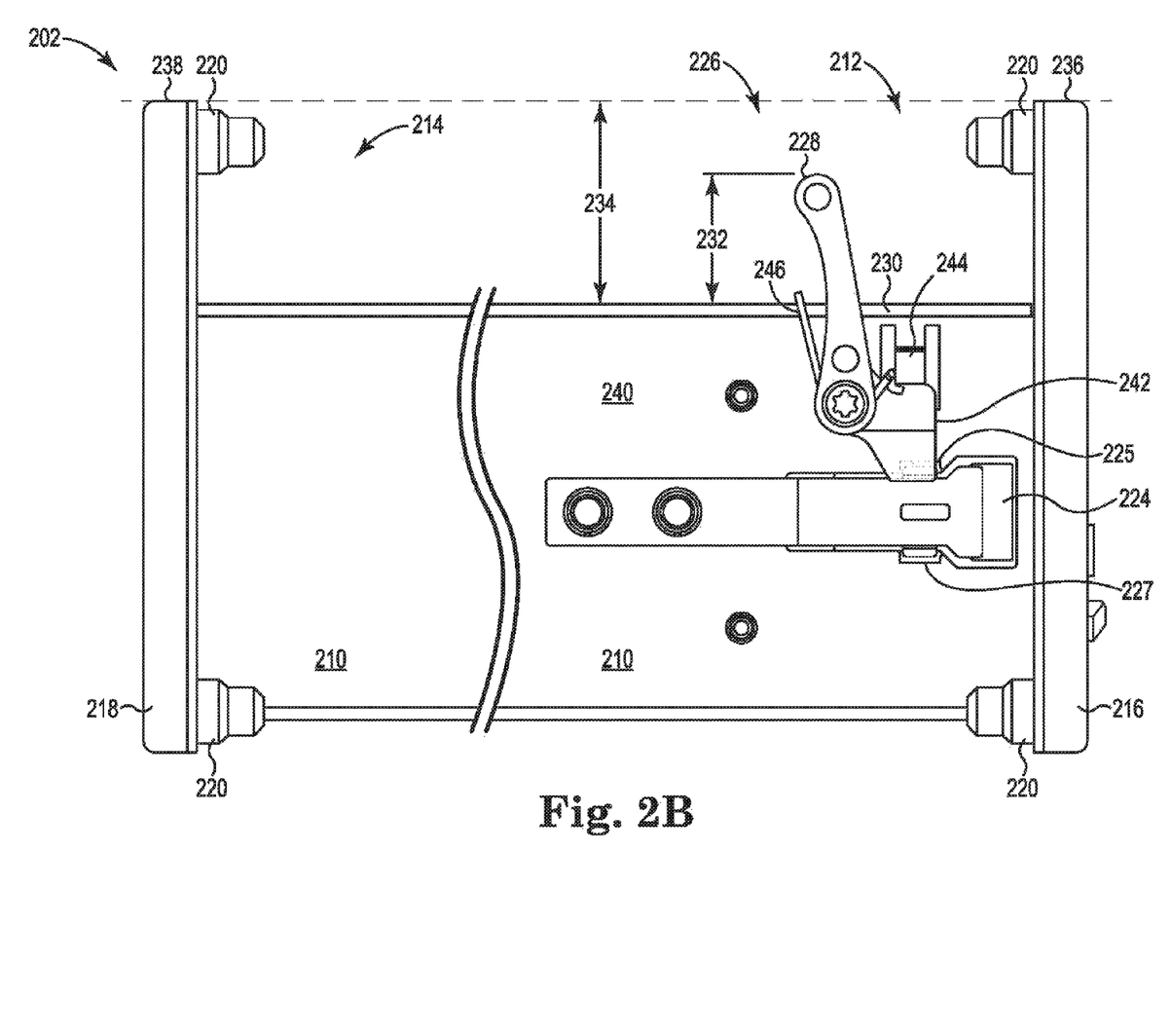
FIG. 2B illustrates an example of a portion of a rail for mounting a rack-mountable component.

As mentioned, FIG. 2B illustrates an example of a portion of a rail 202 for mounting a rack-mountable component according to the present disclosure. The rail 202 can include a longitudinal member 210. The longitudinal member 210 includes a first end 212 and a second end 214. As illustrated in FIG. 2B, a first flange 216 can be coupled to the first end 212 and a second flange 218 can be coupled to the second end 214.

The flanges 216 and 218 can include a number of pins 220. The pins 220 may also be referred to as tabs, nubs, bolts, among others. As an example, each of the flanges 216 and 218 can include two pins 220; however examples are not so limited. The pins 220 can have a variety of shapes; for example, the pins can have a cylindrical shape, a rectangular shape, or a diamond shape, among other shapes. For example, the pins 220 can have a circular cross-section, a square cross-section, a rectangular cross-section, or a diamond cross-section, among others.

The flange 216 and the flange 218 can be configured to engage a rack, e.g., rack 103 as illustrated in FIG. 1. For example, when flange 216 engages rack 103 the pins 220 of flange 216 may mate with holes 107 of left front post 105-A and when flange 218 engages rack 103 the pins 220 of flange 218 may mate with holes 107 of left back post 105-B. Some examples of the present disclosure provide that the pins of a flange, e.g., pins 220 of flange 216, are positioned such that the rail 220 is configured to mount a two rack unit rack-mountable component. However, examples are not so limited. For instance, the pins of a flange, e.g., pins 220 of flange 216, can positioned such that the rail 220 is configured to mount a rack-mountable component having a height greater than two rack units, e.g., 3 U, 4 U, 5 U, and such.

The rail 202 can include a spring 224. The spring 224 can be located proximal, e.g., near or at, to the first end 212 of the longitudinal member 210. Examples of the present disclosure provide that spring 224 is a leaf spring; however, other types of springs may be utilized. The spring 224 has an uncompressed state and a compressed state. When the spring 224 is in the compressed state the rail 202 may be coupled to or uncoupled from a rack, e.g., the rail 202 free to be added to or removed from the rack. When the spring 224 is in the uncompressed state the rail 202 is secured to the rack. For example, when the spring 224 is in the uncompressed state the spring 224 can apply a force, e.g., the spring 224 can apply a force to a surface of left front post 105-A, to secure the rail 202 to the rack.

The spring 224 can include a first wing 225 and a second wing 227. As illustrated in FIG. 2B, a portion of the first wing 225 is located behind a latch 226, which is discussed further herein. Examples of the present disclosure provide that first wing 225 and the second wing 227 are mirror images of one another; however, examples are not so limited. The first wing 225 and a second wing 227 can facilitate movement of the latch across the spring 224, e.g. when a cam arm 242 engages the spring 224 to transition the spring 224 from the uncompressed state to the compressed state, as discussed further herein. For example, the first wing 225 and a second wing 227 can each function as a ramp for the cam arm 242. The first wing 225 and a second wing 227 can help promote smooth engagement and/or disengagement of the cam arm 242 with the spring 224. As illustrated in FIG. 2B, the first wing 225 can extend away from the spring 224 and toward a latch 226 and the second wing 227 can extend away from the spring 224 and away from the latch 226.

The rail 202 can include a latch 226. The latch 226 can be located proximal, e.g., near or at, to the first end 212 of the longitudinal member 210.

The latch 226 can include a trigger arm 228. The trigger arm 228 is configured to be engaged by a user, e.g., a single hand of the user. The trigger arm 228 can be an elongate member.

As illustrated in FIG. 2B, the trigger arm 228 is in a position corresponding to the spring 224 being in the uncompressed state. As illustrated in FIG. 2B, the trigger arm 228 can extend beyond an edge 230 of the longitudinal member 210. For example, the trigger arm 228 can extend a length 232 extend beyond the edge 230 of the longitudinal member 210. However, examples of the present disclosure provide that the length 232, which the trigger arm 228 can extend beyond the edge 230 of the longitudinal member 210 is limited. For example, examples of the present disclosure provide that the length 232, which the trigger arm 228 can extend beyond the edge 230 of the longitudinal member 210 is less than a distance 234. The distance 234 can be defined as a straight line that begins at the edge 230 of the longitudinal member 210 and ends when meeting a plane formed by a terminal portion 236 of flange 216 and a terminal portion 238 of flange 218, where the straight line is parallel to a plane formed by a surface 240 of the longitudinal member 210. Because the length the trigger arm 228 can extend beyond the edge 230 of the longitudinal member 210 is limited the trigger arm 228 can avoid interference with other rack components. The trigger arm 228 can extend beyond the edge 230 of the longitudinal member 210 when spring 224 is in the uncompressed state. Additionally, the trigger arm 228 can extend beyond the edge 230 of the longitudinal member 210 when spring 224 is in the compressed state.

The latch 226 can include a cam arm 242. As illustrated in FIG. 2B, the cam arm 242 is in a position corresponding to the spring 224 being in the uncompressed state. The cam arm 242, which is discussed further herein, is configured to engage the spring 224 to transition the spring 224 from the uncompressed state to the compressed state.

The rail 202 can include a rotational stop 244. Examples of the present disclosure provide that the rotational stop 244 protrudes from the longitudinal member 210, e.g., the rotational stop 244 can protrude from the surface 240 of the longitudinal member 210. The cam arm 242 engages the rotational stop 244, e.g. the cam arm 242 is stopped from traveling in a particular direction by the rotational stop 244, when the spring 224 is in the uncompressed state, as illustrated in FIG. 2B. The trigger arm 228 engages the rotational stop 244, e.g. the trigger arm 228 is stopped from traveling in a particular direction by the rotational stop 244, when the spring 224 is in the compressed state.

The rail 202 can include a recoil member 246. The recoil member 246 can be coupled to the latch 226. The recoil member 246 can bias the cam arm 242 to engage the rotational stop 244. For example, after the cam arm 242 has engaged the spring 224 to transition the spring 224 from the uncompressed state to the compressed state and it is desired to return the spring to the uncompressed state, the recoil member 246 can apply a force, e.g., a spring force, to move the cam arm 242 to engage the rotational stop 244. Examples of the present disclosure provide that the recoil member 246 can be a spring, e.g. a kickback spring, among others.

Figure 3:
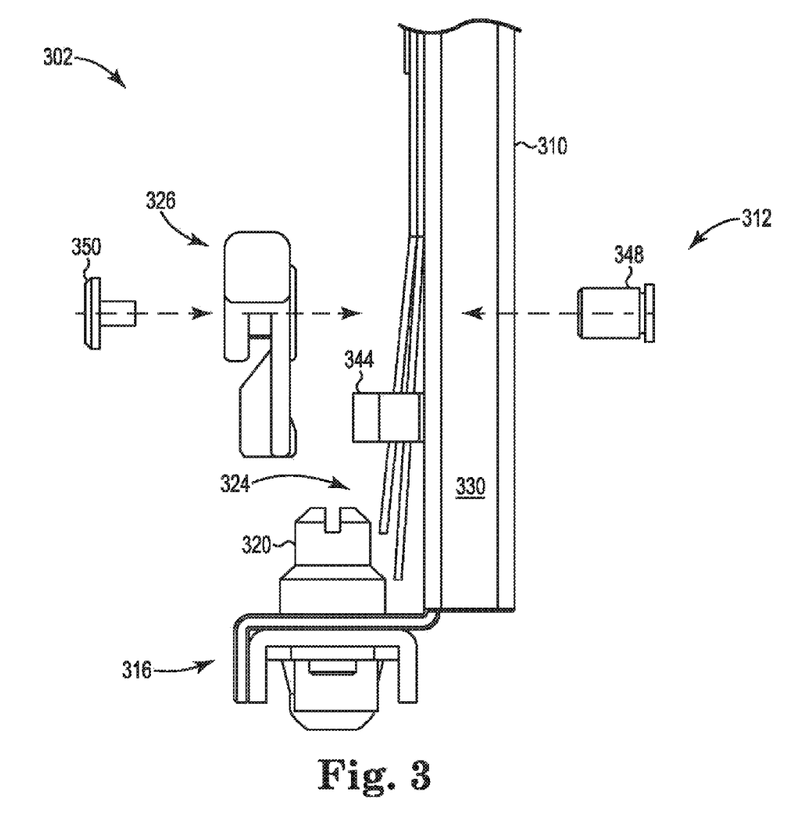
FIG. 3 illustrates a partially exploded view of an example of a portion of a rail for mounting a rack-mountable component.

FIG. 3 illustrates a partially exploded view of an example of a portion of a rail 302 for mounting a rack-mountable component according to the present disclosure.

As illustrated in FIG. 3, the rail 302 can include a standoff 348. While FIG. 3 shows that the latch 326 can be coupled to the longitudinal member 310 of the rail 302, examples of the present disclosure are not so limited. For instance, other coupling members as known by those skilled in the art can be utilized to couple the latch 326 to the longitudinal member 310.

As illustrated in FIG. 3, the standoff 348 can be located proximal, e.g., at or near, to the first end 312 of the longitudinal member 310. The standoff 348 can be coupled to the longitudinal member 310, e.g., the standoff 348 may be positioned in a hole in the longitudinal member 310 configured to house the standoff 348. The latch 326 may be coupled to, e.g., mated with, the standoff 348 and secured thereto by a securing member 350, e.g. a screw. Other elements illustrated in FIG. 3 include the first flange 316m the pin 320, the spring 324, and the rotational stop 344.

Figure 4:
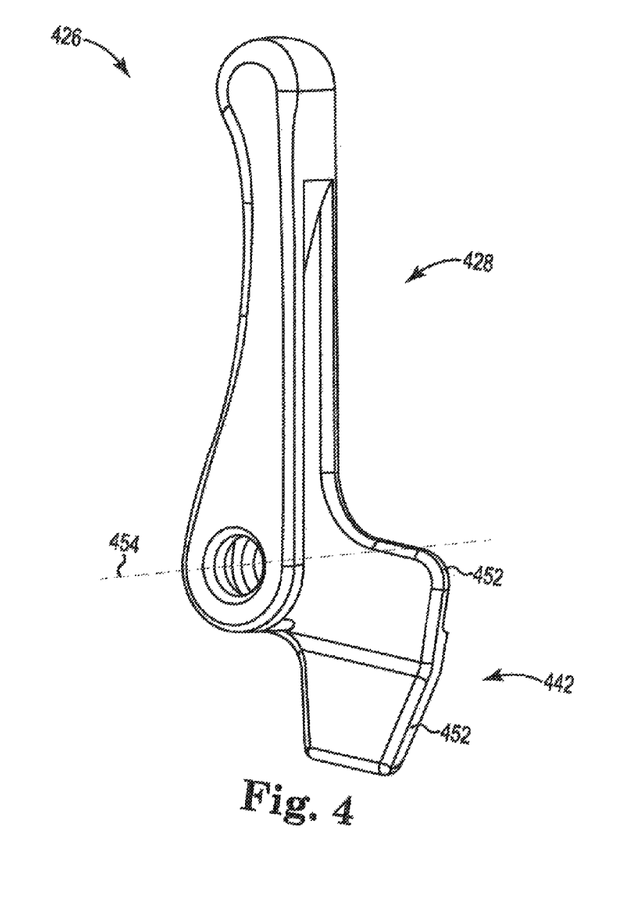
FIG. 4 illustrates an example of a latch for mounting a rack-mountable component.

FIG. 4 illustrates an example of a latch 426 for mounting a rack-mountable component according to the present disclosure. The latch 426 includes the trigger arm 428 and the cam arm 442, as discussed herein. As illustrated in FIG. 4, the cam arm 442 can include an inclined portion 452 that is inclined relative to an uninclined portion 454 of the cam arm 442. As an example, a plane formed by the uninclined portion 454 can be parallel to a plane formed by a surface 240 of the longitudinal member 210, as illustrated in FIG. 2B. The inclined portion 452 can facilitate movement of the latch, e.g., the cam arm, across the spring, e.g. when a cam arm 442 engages the spring to transition the spring from the uncompressed state to the compressed state. The inclined portion 452 can engage the spring 424. Also, FIG. 4 illustrates an axis of rotation 454 of the latch 426.

Figure 5:
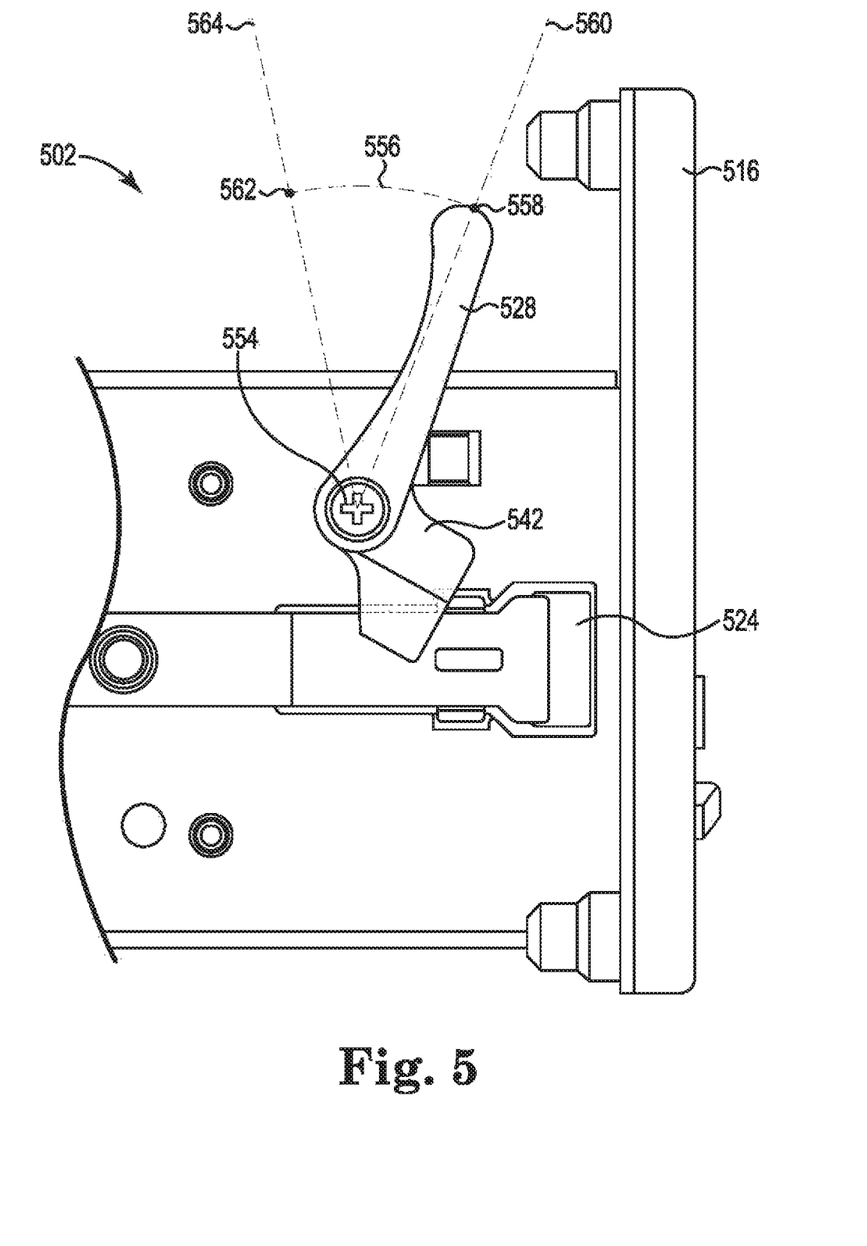
FIG. 5 illustrates an example of a portion of a rail for mounting a rack-mountable component.

FIG. 5 illustrates an example of a portion of a rail 502 for mounting a rack-mountable component according to the present disclosure. As illustrated in FIG. 5, the cam arm 542 has engaged the spring 524 and the spring is in the compressed state. For the cam arm 542 to engage the spring 524, the trigger arm 528 has moved toward the first flange 516, e.g., along path 556. As illustrated in FIG. 5, when the cam arm 542 has engaged the spring 524 and the spring 524 is in the compressed state a portion of the trigger arm 528 is at a location 558 on a first radius 560 of the axis of rotation 554. This location 558 is nearer to the first flange 516 as compared to a location 562 on a second radius 564 of the axis of rotation 554, where the location 562 on the second radius 564 corresponds to a location of a portion the trigger arm 554 when the cam arm 542 is not engaging the spring 524 and the spring 524 is in the uncompressed state, e.g. the location as illustrated in FIG. 2B.

The rails and systems including rails for mounting a rack-mountable component to a rack disclosed herein help provide for easier attachment to and/or removal from the rack as compared to previous rails that have utilized a release latch that engaged in a direction perpendicular to a direction that the rail is to be removed. For example, the rails and systems including rails for mounting a rack-mountable component to a rack disclosed herein can include a latch that engages in a direction parallel to a direction that the rail is to be removed.

As used herein, "a" or "a number of" something can refer to one or more such things. For example, "a number of pins" can refer to one or more pins.

The above specification, examples and data provide a description of the method and applications, and use of the system and method of the present disclosure. Since many examples can be made without departing from the spirit and scope of the system and method of the present disclosure, this specification merely sets forth some of the many possible embodiment configurations and implementations.

What is claimed is:

1. A rail for mounting a rack-mountable component to a rack comprising:
   a longitudinal member having a first flange coupled to a first end of the longitudinal member and a second flange coupled to a second end of the longitudinal member;
   a spring located proximal to the first end and having an uncompressed state and a compressed state;
   a latch located proximal to the first end and having a trigger arm and a cam arm, wherein moving the trigger arm toward the first flange engages the cam arm with the spring to transition the spring from the uncompressed state to the compressed state; and
   a rotational stop, wherein the cam arm engages the rotational stop when the spring is in the uncompressed state.

2. The rail of claim 1, wherein the trigger arm engages the rotational stop when the spring is in the compressed state.

3. The rail of claim 1, wherein the trigger arm has a length that extends beyond an edge of the longitudinal member when the spring is in the uncompressed state.

4. A rail for mounting a rack-mountable component to a rack comprising:
   a longitudinal member having a first flange coupled to a first end of the longitudinal member and a second flange coupled to a second end of the longitudinal member, wherein the first flange and the second flange are configured to engage the rack;
   a spring located proximal to the first end and having an uncompressed state and a compressed state;
   a rotational stop located proximal to the first end and coupled to the longitudinal member;
   a standoff located proximal to the first end and coupled to the longitudinal member; and
   a latch coupled to the standoff and having a trigger arm and a cam arm, wherein the cam arm engages the rotational stop when the spring is in the uncompressed state, the trigger arm engages the rotational stop when the spring is in the compressed state, and rotating the latch relative to the standoff moves the trigger arm toward the first flange and engages the cam arm with the spring to transition the spring from the uncompressed state to the compressed state.

5. The rail of claim 4, wherein the trigger arm has a length that extends beyond an edge of the longitudinal member when spring is in the compressed state.

6. The rail of claim 4, further comprising a recoil member coupled to the latch, wherein the recoil member biases the cam arm to engage the rotational stop.

7. The rail of claim 4, wherein the spring includes a first wing extending away from the spring and toward the latch.

8. The rail of claim 7, wherein the spring includes a second wing extending away from the spring and away from the latch.

9. The rail of claim 4, wherein the cam arm includes an inclined portion that is inclined relative to an uninclined portion of the cam arm and the inclined portion engages the spring.

10. The rail of claim 4, wherein the rail is configured to mount a rack-mountable component having a height equal to two rack units.

11. The rail of claim 4, wherein the rail is configured to mount a rack-mountable component having a height greater than two rack units.

12. A system for mounting a rack-mountable component comprising:
   a first rail including:
      a longitudinal member having a first flange coupled to a first end of the longitudinal member and a second flange coupled to a second end of the longitudinal member, wherein the first flange and the second flange are configured to engage a rack;
      a spring located proximal to the first end and having an uncompressed state and a compressed state;
      a standoff located proximal to the first end and coupled to the longitudinal member;
      a latch coupled to the standoff and having a trigger arm and a cam arm, wherein rotating the latch relative to the standoff moves the trigger arm toward the first flange and engages the cam arm with the spring to transition the spring from the uncompressed state to the compressed state; and
      a rotational stop, wherein the cam arm of the latch of the first rail engages the rotational stop when the spring of the first rail is in the uncompressed state; and
   a second rail including:
      a longitudinal member having a first flange coupled to a first end of the longitudinal member and a second flange coupled to a second end of the longitudinal member, wherein the first flange and the second flange are configured to engage the rack;
      a spring located proximal to the first end and having an uncompressed state and a compressed state;
      a standoff located proximal to the first end and coupled to the longitudinal member;
      a latch coupled to the standoff and having a trigger arm and a cam arm, rotating the latch relative to the standoff moves the trigger arm toward the first flange and engages the cam arm with the spring to transition the spring from the uncompressed state to the compressed state;
      a rotational stop, wherein the cam arm of the latch of the second rail engages the rotational stop when the spring of the second rail is in the uncompressed state.

13. The system of claim 12, wherein the spring of the first rail is a leaf spring.

14. The system of claim 12, wherein the cam arm of the latch of the first rail has an inclined portion configured to facilitate movement of the cam arm across the spring.

15. The system of claim 12,
   wherein the trigger arm of the latch of the first rail engages the rotational stop of the first rail when the spring of the first rail is in the compressed state; and
   wherein the trigger arm of the latch of the second rail engages the rotational stop of the second rail when the spring of the second rail is in the compressed state.

16. The system of claim 12,
   wherein the trigger arm of the latch of the first rail has a length that extends beyond an edge of the longitudinal member when the spring of the first rail is in the uncompressed state; and
   wherein the trigger arm of the latch of the second rail has a length that extends beyond an edge of the longitudinal member when the spring of the second rail is in the uncompressed state.

17. The system of claim 12, further comprising:
   the first rail further including a recoil member coupled to the latch of the first rail, wherein the recoil member biases the cam arm of the latch of the first rail to engage the rotational stop of the first rail; and
   the second rail further including a recoil member coupled to the latch of the second rail, wherein the recoil member biases the cam arm of the latch of the second rail to engage the rotational stop of the first rail.

18. The system of claim 12,
   wherein the spring of the first rail includes a first wing extending away from the spring and toward the latch; and
   wherein the spring of the second rail includes a first wing extending away from the spring and toward the latch.

19. The system of claim 18,
   wherein the spring of the first rail includes a second wing extending away from the spring and toward the latch; and
   wherein the spring of the second rail includes a second wing extending away from the spring and toward the latch.

20. The system of claim 12,
   wherein the cam arm of the latch of the first rail includes an inclined portion that is inclined relative to an uninclined portion of the cam arm and the inclined portion engages the spring of the first rail; and
   wherein the cam arm of the latch of the second rail includes an inclined portion that is inclined relative to an uninclined portion of the cam arm and the inclined portion engages the spring of the second rail.

* * * * *